United States Patent
Kwon et al.

(10) Patent No.: US 8,021,982 B2
(45) Date of Patent: Sep. 20, 2011

(54) METHOD OF SILICIDE FORMATION BY ADDING GRADED AMOUNT OF IMPURITY DURING METAL DEPOSITION

(75) Inventors: Oh-Jung Kwon, Hopewell Junction, NY (US); Anthony G. Domenicucci, Hopewell Junction, NY (US); O Sung Kwon, Hopewell Junction, NY (US); Jin-Woo Choi, Kyeonggi-Do (KR)

(73) Assignees: International Business Machines Corporation, Armonk, NY (US); Samsung Electronics Co., Ltd. (KR); Infineon Technologies AG, Durham, NC (US)

( * ) Notice: Subject to any disclaimer, the term of this patent is extended or adjusted under 35 U.S.C. 154(b) by 107 days.

(21) Appl. No.: 12/563,459

(22) Filed: Sep. 21, 2009

(65) Prior Publication Data

US 2011/0070732 A1    Mar. 24, 2011

(51) Int. Cl.
*H01L 21/44* (2006.01)

(52) U.S. Cl. ........ 438/682; 438/686; 438/678; 438/513; 257/E21.006; 257/E21.051; 257/E21.077; 257/E21.165; 257/E21.17; 257/E21.182; 257/E21.295; 257/E21.296; 257/E21.311

(58) Field of Classification Search .......... 438/197, 438/311, 513, 933, 678, 682, 686, 752, 753; 257/E21.006, 51, 77, 17, 165, 182, 295, 296, 257/311
See application file for complete search history.

(56) References Cited

U.S. PATENT DOCUMENTS

| 4,443,930 | A | 4/1984 | Hwang et al. |
| 6,884,715 | B1 | 4/2005 | Kwon et al. |
| 6,995,430 | B2 * | 2/2006 | Langdo et al. ............ 257/352 |
| 7,153,737 | B2 | 12/2006 | Kwon et al. |
| 7,494,881 | B2 * | 2/2009 | Lochtefeld et al. ........ 438/285 |
| 7,553,762 | B2 | 6/2009 | Hung et al. |
| 7,615,829 | B2 * | 11/2009 | Lochtefeld et al. ........ 257/377 |
| 7,749,847 | B2 * | 7/2010 | Cabral et al. ............ 438/285 |
| 2006/0131170 | A1 | 6/2006 | Seymour et al. |
| 2007/0128867 | A1 | 6/2007 | Domenicucci |
| 2008/0070360 | A1 | 3/2008 | Kwon et al. |

* cited by examiner

*Primary Examiner* — David Nhu
(74) *Attorney, Agent, or Firm* — Scully, Scott, Murphy & Presser, P.C.; Yuanmin Cai

(57) ABSTRACT

A method is provided for forming a metal semiconductor alloy that includes providing a deposition apparatus that includes a platinum source and a nickel source, wherein the platinum source is separate from the nickel source; positioning a substrate having a semiconductor surface in the deposition apparatus; forming a metal alloy on the semiconductor surface, wherein forming the metal alloy comprises a deposition stage in which the platinum source deposits platinum to the semiconductor surface at an initial rate at an initial period that is greater than a final rate at a final period of the deposition stage, and the nickel source deposits nickel to the semiconductor surface; and annealing the metal alloy to react the nickel and platinum with the semiconductor substrate to provide a nickel platinum semiconductor alloy.

18 Claims, 4 Drawing Sheets

METHOD OF SILICIDE FORMATION BY ADDING GRADED AMOUNT OF IMPURITY DURING METAL DEPOSITION

BACKGROUND

The present disclosure relates generally to the field of semiconductor device processing techniques, such as the formation of metal semiconductor alloys, which are typically referred to as metal silicides. Metal silicide formation typically requires depositing a metal, such as Ni, Co, Pd, Pt, Rh, Ir, Zr, Cr, Hr, Er, Mo or Ti, onto a surface of a silicon-containing material or wafer. Following deposition, the structure is then subjected to an annealing step using conventional processes such as thermal annealing. During thermal annealing, the deposited metal reacts with silicon to form a metal silicide. Portions of the metal not formed atop silicon are not reacted during the anneal, and may thus be thereafter selectively removed with respect to the reacted silicide.

SUMMARY

In one embodiment, a method of forming a metal semiconductor alloy is provided that includes providing a deposition apparatus that includes a platinum source and a nickel source, in which a substrate having a semiconductor surface is positioned in the deposition apparatus. The platinum source is separate from the nickel source. During a following deposition stage, the platinum source deposits platinum to the semiconductor surface at an initial rate at an initial period of the deposition stage that is greater than a final rate at a final period of the deposition stage, and the nickel source deposits nickel to the semiconductor surface. Thereafter, the semiconductor substrate is annealed to react the deposited nickel and platinum to provide a nickel platinum semiconductor alloy.

In another embodiment, a method of forming contacts to the source and drain regions of a semiconductor device is provided. In one example, the method begins with providing a semiconductor device having a gate region present overlying a channel portion of a substrate, wherein source and drain regions are present on opposing ends of the channel portion, and positioning the semiconductor device in a deposition apparatus that includes a platinum source and a nickel source, wherein the platinum source is separate from the nickel source. In a following process sequence, a metal alloy is formed on an upper surface of the source and drain regions of the semiconductor device. In one embodiment, forming the metal alloy includes a deposition stage in which the platinum source deposits platinum to the semiconductor surface at an initial rate at an initial period that is greater than a final rate at a final period of the deposition stage, and the nickel source deposits nickel to the semiconductor surface. Thereafter, the metal alloy is annealed to react the nickel and platinum with the semiconductor substrate to provide contacts comprised of a nickel platinum semiconductor alloy to the source and drain regions.

DESCRIPTION OF SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1A:
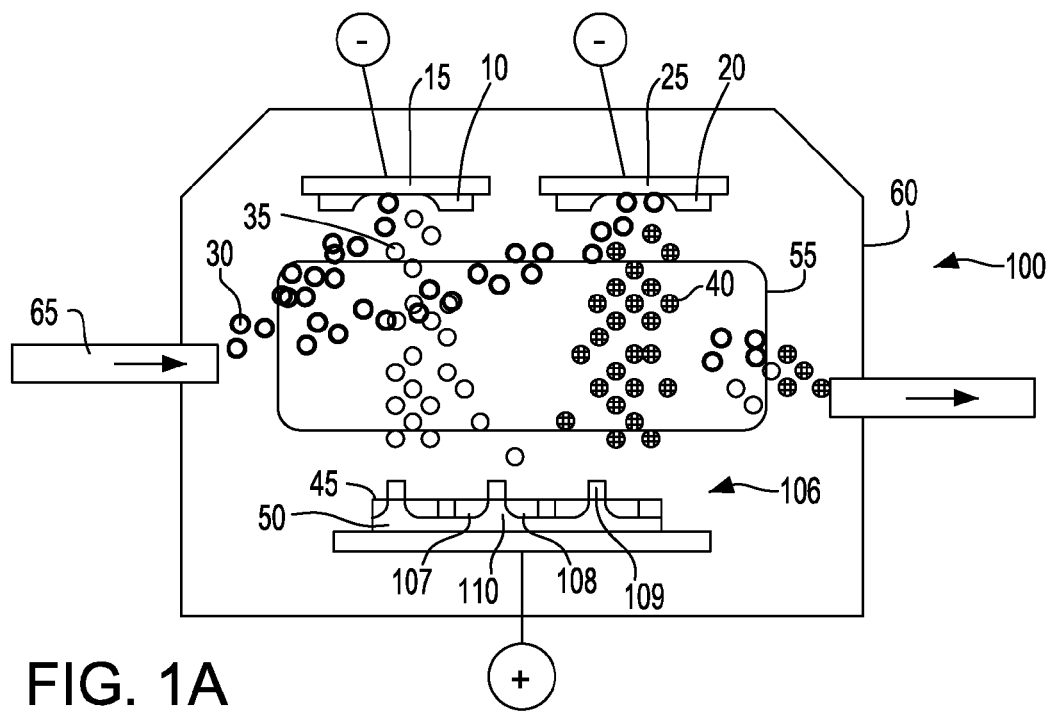
FIG. 1A is a schematic that depicts one embodiment of a deposition apparatus having a platinum source that is separate from the nickel source, as used in accordance with the present invention to provide a metal alloy having a greatest concentration of platinum at an interface between the semiconductor surface and the metal alloy layer deposited thereon.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to methods and structures including metal semiconductor alloys composed of nickel (Ni), platinum (Pt) and silicon (Si), which in some instances can be referred to as nickel platinum silicide. Nickel silicide (NiSi) as utilized in a metal semiconductor alloying process, such as a silicide process or salicide process (self-aligned silicide process), may be characterized as having a low thermal budget and low sheet resistance, which may be employed in a narrow PC line having compatibility with silicon germanium (SiGe). The use of nickel silicide as a contact to the source and drain regions of a semiconductor device, such as a field effect transistor, e.g., MOSFET, typically results in silicide encroachment under the edge of the gate region, which can reduce device yield and reduce device performance. It has been determined that platinum alloyed with nickel can retard nickel diffusion, with reduces the encroachment of the silicide beneath the gate region.

It has been further determined that due to the different diffusion coefficients of nickel and platinum that the platinum when alloyed with nickel diffuses to an uppermost surface of the deposited metal alloy that is opposite the surface on which the alloy has been deposited. It has also been determined that the diffusion of platinum away from the interface of the deposited metal alloy and the semiconductor deposition surface, e.g., silicon containing surface, substantially reduces the ability of platinum to retard the diffusion of nickel, as the platinum that is present opposite the interface between the deposited metal alloy and the semiconductor deposition surface can not retard nickel diffusion. In connection with the above discoveries, a method is provided in which a physical deposition apparatus is utilized to deposit platinum independently of nickel to deposit greater amounts of platinum at the beginning of the deposition process and reduce the platinum content towards the end of the deposition process. When describing the method, the following terms have the following meanings, unless otherwise indicated.

As used herein, a "metal" is an electrically conductive material, wherein metal atoms are held together by the force of a metallic bond, and the energy band structure of metal's conduction and valence bands overlap, and hence, there is no energy gap.

A "metal semiconductor alloy" is an alloy of a metal and semiconductor. In one example, a metal semiconductor alloy is a silicide.

A "silicide" is an alloy of a metal and silicon.

"Salicide" denotes a self-aligned silicide process that includes simultaneous formation of silicide on top of gate electrode and source/drain contact. These two regions is separated by a dielectric spacer at the sidewall of gate electrode.

A "gate region" means a structure used to control output current (i.e., flow of carriers in the channel, e.g., turn "on" or "off") of a semiconductor device through electrical fields.

As used herein, the term "channel" denotes the region underlying the gate region and between the source and drain of a semiconductor device that becomes conductive when the semiconductor device is turned on.

As used herein, the term "drain" means a doped region in semiconductor device located at the end of the channel, in which carriers are flowing out of the semiconductor device through the drain.

As used herein, the term "source" is a doped region in the semiconductor device, from which the majority carriers are flowing into the channel.

As used herein, "p-type" refers to the addition of impurities to an intrinsic semiconductor that creates deficiencies of valence electrons, such as boron, aluminum, gallium or indium to an intrinsic semiconductor surface comprised of silicon.

As used herein, "n-type" refers to the addition of impurities that contributes free electrons to an intrinsic semiconductor, such as antimony, arsenic or phosphorous to a semiconducting surface comprised of silicon.

As used herein, "sputtering" means a method of depositing a film of material on a semiconductor surface. A target of the desired material, i.e., source, is bombarded with particles, e.g., ions, which knock atoms from the target, and the dislodged target material deposits on the semiconductor surface.

The term "separate" as used to describe multiple deposition sources means that each of the deposition sources has a different composition, in which the metal elements of one deposition source is not present in the other deposition sources at levels greater than incidental impurities.

"Dual target sputtering" means a sputtering apparatus having two targets to provide a platinum source that is separate from a nickel source.

"Incidental impurities" denotes any contamination of the deposition source, i.e., platinum source or nickel source. Allowable ranges of impurities are less than 0.05 wt % for each impurity constituent and 0.15 wt % for total impurity content.

"Electrically conductive" and/or "electrically communicating" as used through the present disclosure means a material typically having a room temperature conductivity of greater than $10^{-8}$ $(\Omega\text{-m})^{-1}$.

The term "electrical contact" denotes direct physical contact between two materials, wherein the interface between the two materials is electrically conductive.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

Referring to FIG. 1A, and in one embodiment, the method of forming a metal semiconductor alloy is illustrated that includes providing a deposition apparatus 100 that includes a platinum source 10 and a nickel source 20, wherein the platinum source 10 is separate from the nickel source 20. In one example, the deposition apparatus 100 is a sputtering apparatus comprising two targets, wherein the first target 15 provides the platinum source 10 and the second target 25 provides the nickel source 20. Sputtering is a form of physical vapor deposition (PVD). Examples of sputtering apparatuses include DC diode type systems, radio frequency (RF) sputtering, magnetron sputtering, and ionized metal plasma (IMP) sputtering. Typically, in the sputtering deposition process, high energy particles 30 strike a solid slab of high-purity target material (first target 15 providing the platinum source 10 and second target 25 providing the nickel source 20), in which the high energy particles 30 physically dislodge atoms of the platinum 35 and atoms of nickel 40. These sputtered atoms 35, 40 typically migrate through a vacuum and deposit on the deposition surface, e.g., the semiconductor surface 45 of a substrate 50.

In one embodiment, sputtering may begin with generating charged high-energy particles 30, such as positively charged argon ions, in a plasma 55 in a high vacuum sputtering chamber 60 followed by accelerating the charged high-energy particles 30 at a target material (first target 15 and second target 25) having an opposing potential, such as a target material having a negative charge. During acceleration, the high-energy particles 30, e.g., ions, gain momentum and strike the target 15, 25. The high-energy particles 30, i.e., ions, physically dislodge (sputter) atoms from the target 15, 25, and the sputtered atoms 35, 40 migrate to the deposition surface 45. The sputtered atoms 35, 40 condense and form a thin film on the deposition surface 45 with essentially the same material composition as the target 15, 25. Excess material is removed from the sputtering chamber 60 containing the substrate 50 by a vacuum pump through exhaust tube 70.

To illustrate sputtering, in accordance with one embodiment of the invention, FIG. 1A shows the chamber 60 of a sputter apparatus 100 having two separate and independent targets, i.e., first target 15 and the second target 25. In one embodiment, the first target 15 provides the platinum source 10 and the second target 25 provides the nickel source 20. In one embodiment, the first target 15 that provides the platinum source 10 is composed of solid elemental platinum. In one embodiment, the purity of the first target 15 that provides the platinum source 10 may be as great as 99% platinum, and in some examples the purity of the first target 15 can be as great as 99.999% platinum. In one embodiment, the second target 25 that provides the nickel source 20 is composed of solid elemental nickel. In one embodiment, the purity of the nickel source 20 may be as great as 99% nickel, and in some examples the purity of the nickel source 20 can be as great as 99.999% nickel. Although, typically not preferred, the first target 15 that provides the platinum source 10 and the second target 25 that provides the nickel source 20 may each have incidental impurities.

The first target 15 that provides a platinum source 10 and the second target 25 that provides the nickel source 20 may both be contained within a chamber 60, in which the substrate 50 including the semiconductor surface 45 is positioned within the chamber 60 during the deposition stage that provides the metal alloy on the semiconductor surface 45. The first target 15 that provides a platinum source 10 and the second target 25 that provides a nickel source 20 may both be charged, e.g., negatively charged, and may be referred to as a cathode. The substrate 50 once placed in the chamber 60 is typically charged opposite, e.g., positively charged, the first target 15 that provides a platinum source 10 and the second target 25 that provides a nickel source 20. The substrate 50 is typically referred to as an anode.

In one embodiment, to sputter the material from the first and second target 15, 25, a high density of positive ions, i.e., particles 30, from an argon gas glow discharge is introduced into the chamber 60 through a gas deliver tube 65 and attracted to the negatively charged first target 15 that provides the platinum source 10 and the second target 25 that provides the nickel source 20. The positive ions, i.e., particles 30, from the argon gas flow discharge strike the negatively charged first target 15 dislodging the atoms of platinum 35 to be deposited from the charged first target 15 that provides the platinum source 10, and strike the negatively charged second target 25 dislodging the atoms of nickel 40 from the nickel source 20. In order to dislodge atoms from the first and second targets, 15, 25, the incident ion energy of the high-energy particles 30 must large enough to dislodge the atoms, but at the same time may not be great enough to penetrate through the targets 15, 25 in their entirety. In one embodiment, the ion energies of the high-energy particles 30, e.g., positive ions from the argon gas flow discharge, range from 500 eV to 5,000 eV. In another embodiment, the ion energies of the high-energy particles 30, e.g., positive ions from the argon gas flow discharge, range from 1,500 eV to 4,500 eV.

Typically, the high-energy particles 30, e.g., positive ions from the argon gas flow discharge, result from the formation of a plasma 55 from a gas. The plasma 55 may be produced using a DC diode sputtering ("also referred to as DC sputtering"), radio frequency (RF) sputtering, magnetron sputtering, and ionized metal plasma (IMP) sputtering. DC diode sputtering produces a plasma 55 utilizing an electric field that is produced by a DC voltage applied between the cathode (the substrate 50 having the semiconductor surface 45) and the anode (first target 15, e.g., platinum source 10, and the second target 25, e.g., nickel source 20). The plasma 55 may also be produced using a RF sputtering system, in which an RF field is used to create the plasma 55 instead of the DC electric field that is employed in a DC diode sputtering system. In one example, the RF frequency is on the order of approximately 13.56 MHz, which is applied to the back surfaces of the first and second targets 15, 25, i.e., platinum source 10 and the nickel source 20, and is capacitively coupled to the first and second targets 15, 25. The RF frequency produces a negative charge on the first and second targets 15, 25. The plasma 55 may also be produced using magnetron sputtering, which employs magnets configured around and behind the first target 15, e.g., platinum source 10, and the second target 25, e.g., nickel source 20, to capture and restrict the high-energy particles 30, e.g., positive ions from the argon gas flow discharge, to impact the front of the first and second targets 15, 25. In ionized metal plasma (IMP) sputtering, the sputtered metal from the first and second targets 15, 25 is ionized in an RF plasma at a pressure ranging from 20 mtorr to 40 mtorr.

In one embodiment, the charge of the first and second targets 15, 25 may be selected to control the deposition rate of platinum and nickel. More specifically, to select a target 15, 25 for sputtering, the charge of the target 15, 25 may be selected to be opposite the high-energy particles 30, e.g., the positive ions from an argon gas glow discharge, and in order to avoid sputtering from a target 15, 25, the charge of the target 15, 25 may be selected to be the same as the high-energy particles 30, e.g., the positive ions from an argon gas glow discharge, and therefore provide a repulsive force between the targets 15, 25 and the high energy particles 30 having the same charge.

Vacuum conditions in the sputtering chamber 60 are typically selected to create the plasma 55 and maintain purity of the deposited films with the base vacuum typically being at $10^{-7}$ Torr during the initial pump down of the sputtering chamber 60. Once the high-energy particles 30, e.g., positive ions from the argon gas flow discharge, and the sputtered platinum and nickel from the platinum source 10, i.e., first target 15, and the nickel source 20, i.e., second target 25, the pressure of the sputtering chamber 60 may increase to $10^{-3}$ Torr. The deposition process further includes an Ar flow rate ranging from 10 sccm to 100 sccm during deposition, a DC source with permanent magnet ranging from 2000 W to 3000 W, and a deposition temperature of about 200° C.

Figure 1B:
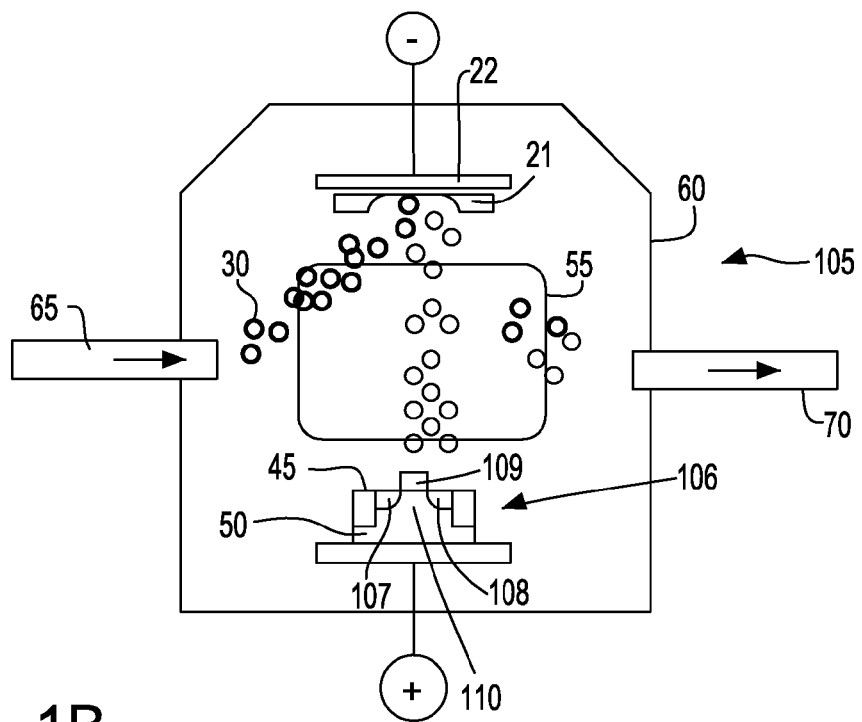
FIG. 1B is a schematic that depicts a deposition apparatus having a single source to deposit both platinum and nickel, as used to provide a comparative example in which the greatest concentration of platinum is not present at the interface between the semiconductor surface and the deposited metal alloy layer.

FIG. 1B is a schematic that depicts a sputter deposition apparatus 105 having a single source 21, i.e., target, to deposit both platinum and nickel. More specifically, in the sputter deposition apparatus 105 that is depicted in FIG. 1B, the single deposition source 21 is provided by target 22 that is composed of a platinum nickel alloy. FIG. 1B depicts an example of a sputter apparatus 105 that provides a comparative example of a nickel platinum semiconductor alloy, in which the greatest concentration of platinum is not present at the interface between the semiconductor surface and the deposited metal alloy layer. With the exception of the single source 21, i.e., target, to deposit both platinum and nickel, the remaining systems and structures of the sputter deposition apparatus 105 depicted in FIG. 1B is the same as the sputter deposition apparatus 100 that is depicted in FIG. 1A.

Referring to FIGS. 1A and 1B, a substrate 50 having a semiconductor surface 45 is positioned in the deposition apparatus 100, 105. The semiconductor surface 45 may be any semiconducting material, such as Si, SiGe, GaAs, InAs and other like semiconductors. Further, the semiconductor surface 45 may include layered semiconductors such as Si/Ge and Silicon-On-Insulators. Si-containing materials include, but are not limited to: Si, single crystal Si, polycrystalline Si, SiGe, single crystal silicon germanium, polycrystalline silicon germanium, or silicon doped with carbon, amorphous Si, silicon-on-insulator substrates (SOI) and SiGe-on-insulator (SGOI). The Si-containing material further comprises n-type or p-type dopants. In one embodiment, semiconductor devices 106 are present on the semiconductor surface 45 of the substrate 50. In one example, the semiconductor devices 106 are field effect transistors (FETs), such as n-type and/or p-type FETs. Each field effect transistor (FET) may include a source region 107, a drain region 108, and a gate structure 109, in which a channel region 110 is present underlying the gate structure 109 and between the source region 107 and the drain region 108.

Following positioning of the substrate 50 having the semiconductor surface 45 within the sputtering chamber 60 of the deposition apparatus, 100, 105, positive ions, i.e., particles 30, are impacted to the first and second targets 15, 25 to provide the platinum source 10 and the nickel source 20, wherein atoms of nickel 40 and atoms of platinum 35 dislodge from the first and second targets 15, 25, which then deposit on the semiconductor surface 45. Forming the metal alloy comprises a deposition stage in which the platinum 10 deposits atoms of platinum 35 to the semiconductor surface 45 at an initial rate at an initial period that is greater than a final rate at a final period of the deposition stage, and the nickel source 20 deposits atoms of nickel 40 to the semiconductor surface 45.

In one embodiment, the initial rate at which the platinum source 10 deposits atoms of platinum 35 at a rate that provides a metal alloy in which the platinum content of the deposited metal alloy ranges from 10 wt. % to 100 wt. %, typically being on the order of 20 wt % or greater. In another example, the platinum source 10 deposits atoms of platinum 35 at a rate that provides a metal alloy in which the platinum content of the deposited metal alloy that ranges from 5 wt. % to 10 wt. %.

In one embodiment, the initial rate at which the nickel source 20 deposits atoms of nickel 40 at a rate that provides a metal alloy in which the nickel content of the deposited metal alloy ranges from 90 wt. % to 0 wt. %. In another embodiment, the nickel source 20 deposits atoms of nickel 40 at a rate that provides a metal alloy in which the nickel content of the deposited metal alloy ranges from 95 wt. % to 90 wt. %. Typically, the deposited atoms of nickel 40 provide the remainder of the deposited metal alloy in the initial time period.

The initial time period typically has a duration of 0.25 seconds to 2.5 seconds. In another embodiment, the initial time period has a duration of 0.5 seconds to 2.0 seconds. In an even further embodiment, the initial time period has a duration of less than 1.0 second. The thickness of the metal alloy that is deposited during the initial time period is typically between a fifth and a third of the final thickness of the metal alloy.

In one embodiment, the final rate at which the platinum source 10 deposits atoms of platinum 35 at a rate that provides a metal alloy in which the platinum content of the deposited metal alloy is approximately ranges from 0 wt. % to 20 wt. %, typically being on the order of 10 wt % or less. In another example, the platinum source 10 deposits atoms of platinum 35 at a rate that provides a metal alloy in which the platinum content of the deposited metal alloy ranges from 5 wt. % to 10 wt. %.

In one embodiment, the final rate at which the nickel source 20 deposits atoms of nickel 40 at a rate that provides a metal alloy in which the nickel content of the deposited metal alloy ranges from 100 wt. % to 80 wt. %. In another embodiment, the nickel source 20 deposits atoms of nickel 40 at a rate that provides a metal alloy in which the nickel content of the deposited metal alloy ranges from 95 wt. % to 90 wt. %. Typically, the deposited atoms of nickel 40 provide the remainder of the deposited metal alloy in the final time period.

The final time period typically has a duration of 0.25 seconds to 2.5 seconds and begins following the termination of the initial time period. In another embodiment, the final time period has a duration of 0.5 seconds to 2.0 seconds. The thickness of the metal alloy that is deposited during the initial time period is typically between four fifths and two thirds of the final thickness of the metal alloy. In one embodiment, the combination of the initial time period and the final time period results in a deposition stage that has a duration of 5.0 seconds or less.

The deposition stage may also include an intermediate time period between the initial time period and the final time period. The intermediate time period typically has a duration of 0.25 seconds to 2.5 seconds. In another embodiment, the intermediate time period has a duration of 0.5 seconds to 2.0 seconds. In one embodiment, during the initial time period atoms of platinum 40 are deposited by the platinum source 10 and no nickel is deposited, wherein during the intermediate time period atoms of platinum 40 are deposited by the platinum source 10 and atoms of nickel 35 are deposited by the nickel source 20, and during the final time period atoms of nickel 35 are deposited by the nickel source 20 and no platinum is deposited.

During the intermediate time period atoms of platinum and nickel 35, 40 are codeposited, in which the platinum content in the metal alloy deposited during the intermediate time period is graded in a decreasing amount in a direction away from the semiconductor surface 45 and the nickel content of the metal alloy is graded in an increasing amount in the direction away from the semiconductor surface 45.

In an even further embodiment, the initial rate of platinum deposited at the initial period comprises greater than 80% of the deposited metal alloy during the initial time period and the nickel deposited during the initial time period comprises less than 20% of the deposited metal alloy, wherein the initial time period is less than 1.0 second. In another embodiment, the initial rate of platinum deposited at the initial period comprises greater than 10% of the deposited metal alloy during the initial time period and the nickel deposited during the initial time period comprises less than 90% of the deposited metal alloy, wherein the initial time period is less than 1.0 second.

Figure 2A:
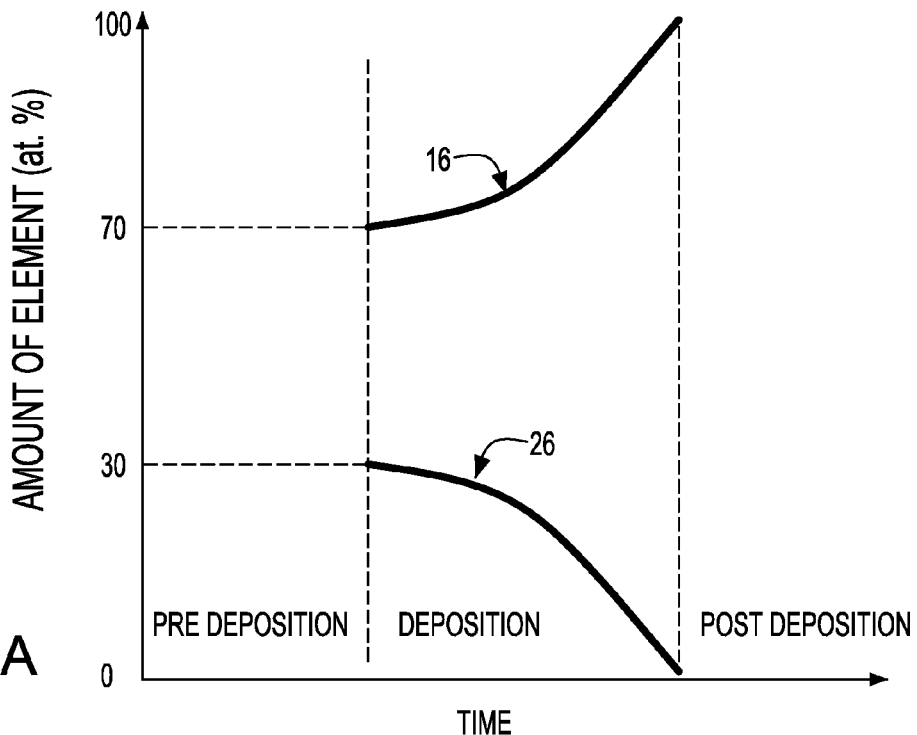
FIG. 2A is a plot depicting the amount of platinum (Pt) and nickel (Ni) being deposited as function of time by a deposition apparatus consistent with the schematic depicted in FIG. 1A to provide a metal alloy having a greatest concentration of platinum at an interface between the semiconductor surface and the deposited metal alloy layer, in accordance with one embodiment of the present invention.

FIG. 2A is a plot depicting one embodiment of the deposition sequence in accordance with the present invention. FIG. 2A depicts the amount (more specifically deposition rate) of platinum (Pt) and nickel (Ni) being deposited in the metal alloy (y-axis) as function of time (x-axis (seconds)) with a deposition apparatus consistent with the schematic depicted in FIG. 1A, which includes a platinum source 10, i.e., target, that is separate from the nickel source 20. The deposition sequence that is depicted in FIG. 2A provide a metal alloy having a greatest concentration of platinum at an interface between the semiconductor surface 45, e.g., upper surface of the source and drain regions 107, 108, and the deposited metal alloy layer.

The plot depicted by reference number 16 is a plot of the nickel content in the metal alloy being deposited during the deposition stage as a function of time. As illustrated in FIG. 2A, in one embodiment the nickel content being deposited may be substantially constant. The plot depicted by reference number 26 is a plot of the platinum content in the metal alloy being deposited during the deposition stage as a function of time. As illustrated in FIG. 2A, in order to provide a metal alloy having a greatest concentration of platinum at an interface between the semiconductor surface 45, e.g., upper surface of the source and drain regions 107, 108, and the deposited metal alloy layer, the platinum content during the initial time periods of the deposition stage is greater than the platinum content in the final time periods of the deposition stage. Although the plot of the platinum deposition 26 depicts a parabolic decrease in the platinum content being deposited with increasing time, the decrease in the platinum content may also be linear.

Figure 2B:
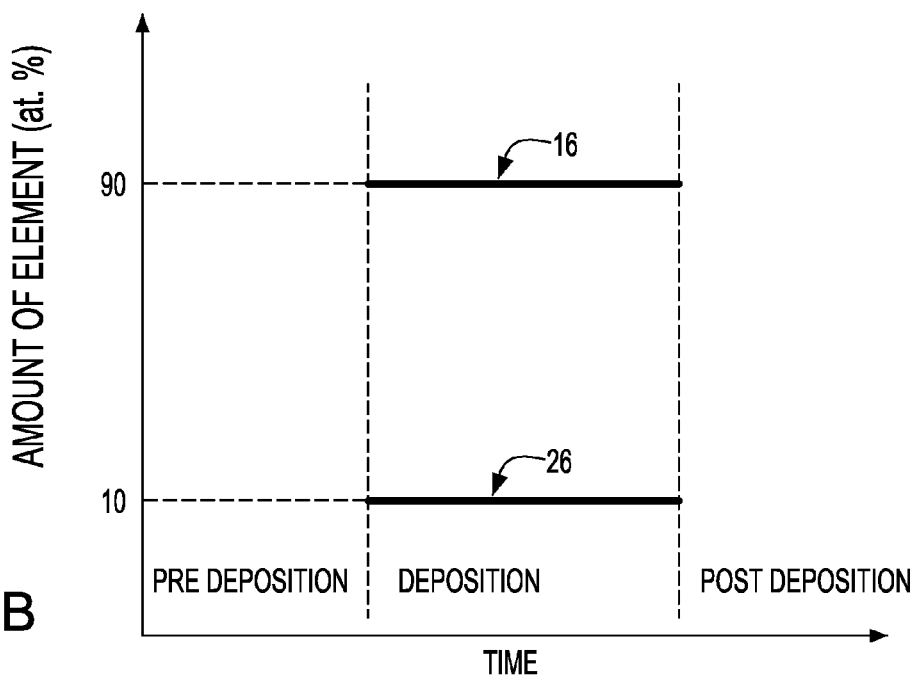
FIG. 2B is a plot depicting the amount of platinum (Pt) and nickel (Ni) being deposited as function of time by a deposition apparatus consistent with the schematic depicted in FIG. 1B, as used to provide a comparative example in which the greatest concentration of platinum is not present at the interface between the semiconductor surface and the deposited metal alloy layer.

FIG. 2B is a plot depicting the amount of platinum and nickel being deposited as function of time by a deposition apparatus consistent with the schematic depicted in FIG. 1B, as used to provide a comparative example in which the greatest concentration of platinum is not present at the interface between the semiconductor surface and the deposited metal alloy layer, but present at the upper surface of the metal alloy layer. In the deposition apparatus 105 depicted in FIG. 1B, the single target 22 is the only source of the metal atoms, i.e., nickel and platinum atoms, that are to be deposited. Therefore, because the only source 21 of the metal atoms is the single target 22, the deposited metal alloy will have a composition that is the same as the single target 22. For example, if the single target 22 is composed of an alloy of 80 wt % nickel and 20 wt % platinum, the deposited metal alloy will have a composition of 80 wt % nickel and 20 wt % platinum. Further, the deposition apparatus 105 that is depicted in FIG. 1B, which only has a single deposition target 22, fails to provide the means by which platinum may be deposited to have a greater content at the interface between the metal alloy and the semiconductor surface 45 on which the metal alloy is deposited.

Referring to FIGS. 3A-4B, following the deposition stage, the deposited metal alloy is annealed to provide the metal semiconductor alloy 80, i.e., nickel platinum semiconductor alloy, e.g. nickel platinum silicide. Annealing the metal alloy causes the nickel and platinum to react with the semiconductor surface 45 to provide a nickel platinum semiconductor alloy. Annealing may be provided by thermal anneal, rapid thermal anneal, laser anneal or combinations thereof. Annealing is at a temperature ranging from about 250° C. to about 600° C.

When the metal semiconductor alloy 80 is present on the surface of the source and drain regions 107, 108 of a semiconductor device 106, such as a field effect transistor, the metal semiconductor alloy 80, i.e., nickel platinum semiconductor alloy, e.g., nickel platinum silicide, provides a contact 90 to the source and drain regions 107, 108.

Figure 3A:
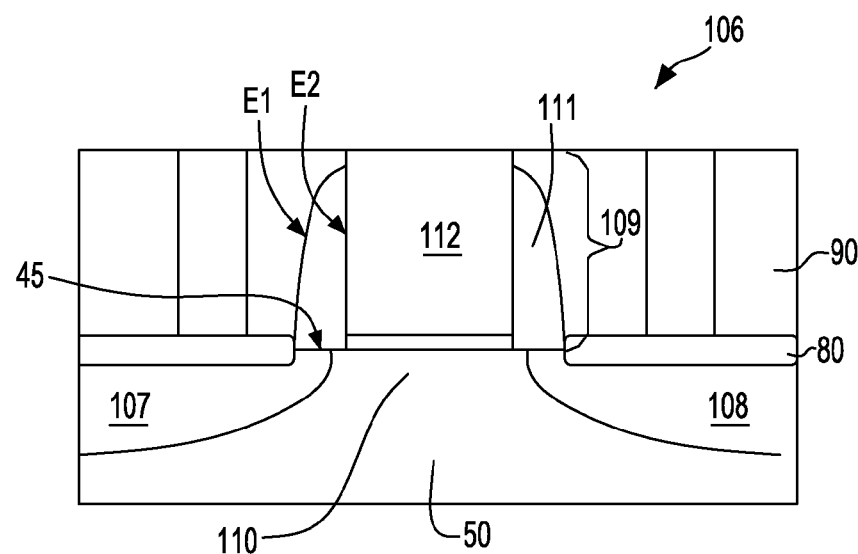
FIG. 3A is a side cross-sectional view of a semiconductor device having a contact composed of a metal semiconductor alloy to the source and drain regions of a semiconductor device, in which the metal semiconductor alloy is formed using the deposition apparatus that is consistent with FIG. 1A, and a deposition stage consistent with FIG. 2A, wherein the metal semiconductor alloy does not encroach beyond the edge of the gate region, in accordance with one embodiment of the present invention.

FIG. 3A depicts a semiconductor device 106, e.g., field effect transistor, having a contact 90 composed of a metal semiconductor alloy 80 to the source and drain regions 107, 108 of the semiconductor device 106, e.g., field effect transistor, in which the metal semiconductor alloy 80 is formed using the deposition apparatus 100 that is consistent with FIG. 1A, and a deposition stage that is consistent with FIG. 2A, wherein the metal semiconductor alloy 80 does not encroach beyond the edge of the gate region 109. By not encroaching beyond the end of the gate region 109 it is meant that the metal semiconductor alloy 80 does not extend beyond the outermost edge E1 of the spacers 111 that are abutting the gate conductor 112 of the gate region 109. In one embodiment, in which the spacers are not present, by not encroaching beyond the end of the gate region 109 it is meant that the metal semiconductor alloy 80 does not extend beyond the outermost edge E2 the gate conductor 112. When present, the encroachment of the metal semiconductor alloy 80 beyond the edge of the gate region 109 does not extend to greater than 10 nm, when measured from the edge E1 of the spacers 111, or the edge E2 of the gate conductor 112 (in the embodiments of the invention in which the spacers 111 are not present). In another embodiment, encroachment of the metal semiconductor alloy 80 beyond the edge of the gate region 109 does not extend to greater than 10 nm, when measured from the edge E1 of the spacers 111, or the edge E2 of the gate conductor 112 (in the embodiments of the invention in which the spacers 111 are not present). In an even further embodiment, encroachment of the metal semiconductor alloy 80 beyond the edge of the gate region 109 does not extend to greater than 5 nm, when measured from the edge E1 of the spacers 111, or the edge E2 of the gate conductor 112 (in the embodiments of the invention in which the spacers 111 are not present).

Figure 3B:
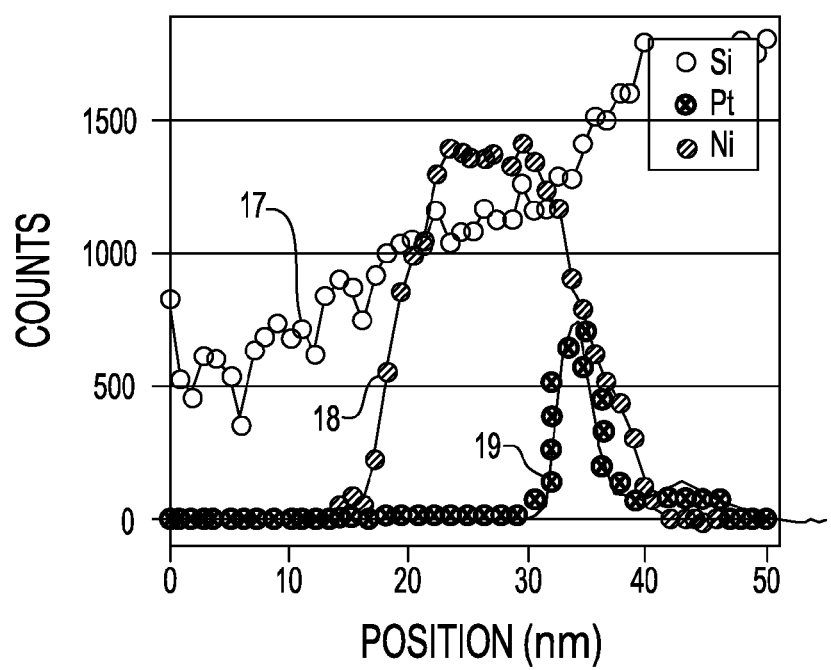
FIG. 3B is a plot illustrating the composition of the semiconductor device depicted in FIG. 3A, in accordance with one embodiment of the present invention.

FIG. 3B is a plot illustrating the composition of the metal semiconductor alloy 80 depicted to FIG. 3A. The plot depicted in FIG. 3B illustrates data from a simulated energy dispersive X-ray (EDX) analysis of a metal semiconductor alloy 80 produced using the deposition apparatus depicted in FIG. 1A and with a deposition stage consistent with FIG. 2A. FIG. 3B has been included for illustrative purposes, and is not intended to limit the invention. The X-axis is the counts at which a material is detected in EDX analysis, and the y-axis is the dept at which the measurement is taken, as measured from the upper surface of the metal semiconductor alloy.

The plot depicted by reference number 17 is a plot of the silicon content of the metal semiconductor alloy. The plot depicted by reference number 18 is the nickel content of the metal semiconductor alloy. The plot depicted by reference number 19 is the platinum content of the metal semiconductor alloy. Measurements of the composition of the metal semiconductor alloy begins at about the 15 nm point of the x-axis, which represents the metal semiconductor alloy's upper surface. The nickel content (plot depicted by reference number 18) increases from initial detection at 15 nm to a peak at approximately 20 nm, wherein the nickel content starts to decrease at approximately 30 nm. The platinum content (plot depicted by reference number 19) is initially detected at 30 nm, and peaks at approximately 35 nm, wherein platinum is no longer detected at greater than approximately 40 nm. The silicon content (plot depicted by reference number 17) steadily increase, with dramatic increases between 35 nm and 40 nm indicating that the interface between the metal semiconductor alloy and the semiconductor surface on which the metal semiconductor alloy is formed is present at a depth between 35 nm and 40 nm.

Figure 4A:
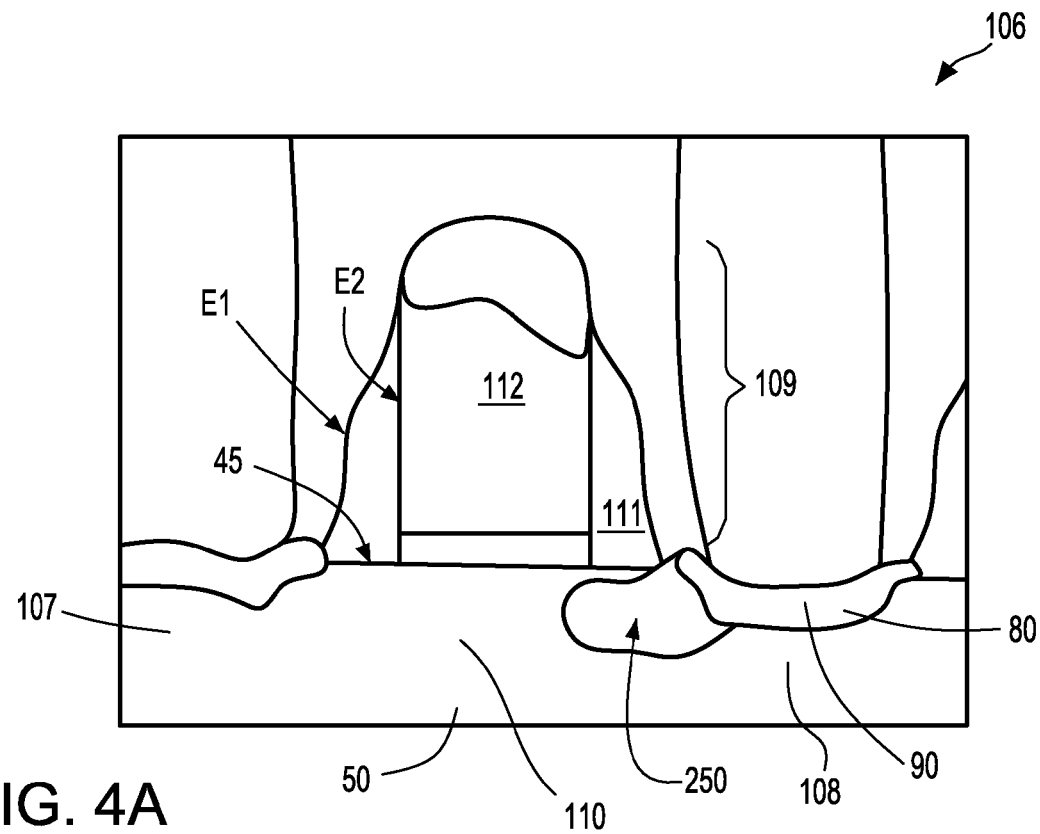
FIG. 4A is a side cross-sectional view of a semiconductor device having a contact composed of a metal semiconductor alloy to the source and drain regions of the semiconductor device, in which the metal semiconductor alloy is formed using the deposition apparatus that is consistent with FIG. 1B, and a deposition stage consistent with 2B, wherein the metal semiconductor alloy encroaches beyond the edge of the gate region, in accordance with one embodiment of the present invention.

FIG. 4A depicts a semiconductor device 106, e.g., field effect transistor, having a contact 90 composed of a metal semiconductor alloy 80 to the source and drain regions 107, 108 of the semiconductor device 106, e.g., field effect transistor, in which the metal semiconductor alloy 80 is formed using the deposition apparatus 105 that is consistent with FIG. 1B, and a deposition stage consistent with FIG. 2B, wherein the metal semiconductor alloy 80 encroaches beyond the edge of the gate region 109. The portion of the metal semiconductor alloy 80 that encroaches beyond the edge of the gate region 109 is identified by reference number 250. In one embodiment, the metal semiconductor alloy 80 extends beyond the edge of the gate region 109 greater than 5 nm, as measured from the edge E1 of the spacers 111, or the edge E2 of the gate conductor 112 (in the embodiments of the invention in which the spacers 111 are not present). In another embodiment, encroachment of the metal semiconductor alloy 80 extends beyond the edge of the gate region 109 by greater than 10 nm, when measured from the edge E1 of the spacers 111, or the edge E2 of the gate conductor 112 (in the embodiments of the invention in which the spacers 111 are not present). In an even further embodiment, encroachment of the metal semiconductor alloy 80 beyond the edge of the gate region 109 extends greater than 15 nm, when measured from the edge E1 of the spacers 111, or the edge E2 of the gate conductor 112 (in the embodiments of the invention in which the spacers 111 are not present).

Figure 4B:
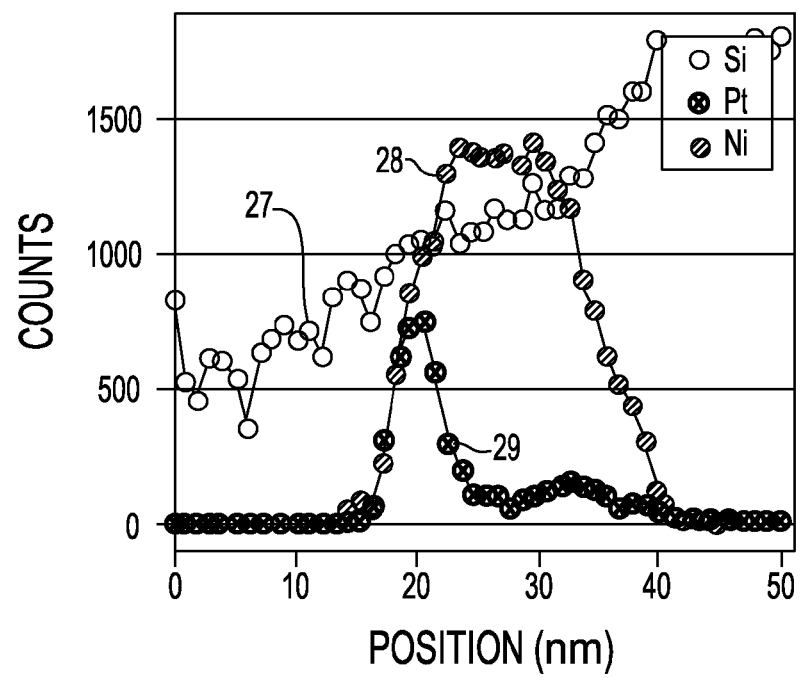
FIG. 4B is a plot illustrating the composition of the metal semiconductor alloy depicted in FIG. 4A, in accordance with one embodiment of the present invention.

FIG. 4B is a plot illustrating the composition of the metal semiconductor alloy 80 depicted to FIG. 4A. The plot depicted in FIG. 4B of data from a energy dispersive X-ray (EDX) analysis of a metal semiconductor alloy 80 produced using the deposition apparatus depicted in FIG. 1B with a deposition stage as shown in FIG. 2B. The X-axis is the counts at which a material is detected in EDX analysis, and the y-axis is the depth at which the measurement is taken as measured from the upper surface of the metal semiconductor alloy.

The plot depicted by reference number 27 is a plot of the silicon content of the metal semiconductor alloy. The plot depicted by reference number 28 is the nickel content of the metal semiconductor alloy. The plot depicted by reference number 29 is the platinum content of the metal semiconductor alloy. Measurements of the composition of the metal semiconductor alloy begins at about the 15 nm point of the x-axis, which represents the metal semiconductor alloy's upper surface. The nickel content (plot depicted by reference number 18) increases from initial detection at 15 nm to a peak at approximately 20 nm, wherein the nickel content starts to decrease at approximately 30 nm. The platinum content (plot depicted by reference number 19) is initially detected at 15 nm, and peaks at approximately 20 nm, wherein platinum is no longer detected at greater than approximately 25 nm, which illustrates that the platinum is only present at an upper surface of the metal semiconductor alloy. The silicon content (plot depicted by reference number 17) steadily increase, with dramatic increases between 35 nm and 40 nm indicating that the interface between the metal semiconductor alloy and the semiconductor surface on which the metal semiconductor alloy is formed is present at a depth between 35 nm and 40 nm.

Comparison of FIGS. 3A and 3B to FIGS. 4A and 4B illustrates that that platinum present at the upper surface of the metal semiconductor alloy 80, as depicted in FIG. 4B, does not restrict the encroachment of the metal semiconductor alloy 80 beyond the edge of the gate region 109, in which encroachment of a metal semiconductor alloy is clearly depicted in FIG. 4B. FIGS. 3A and 3B illustrate that the method of the present invention reduces encroachment of the metal semiconductor alloy, in which a physical deposition apparatus, as depicted in FIG. 1A, deposits platinum (Pt) independently of nickel (Ni) to deposit greater amounts of platinum (Pt) at the beginning of the deposition process and reduce the platinum (Pt) content towards the end of the deposition process, as depicted in FIG. 2A. FIG. 3B further illustrates that the deposition apparatus depicted in FIG. 1A and the deposition stage depicted in FIG. 2A result in a metal semiconductor alloy 80 having a greater concentration of platinum at the interface of the semiconductor surface 45 and the metal semiconductor alloy 80 deposited on the semiconductor surface 45.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

The invention claimed is:

1. A method of forming a metal semiconductor alloy, the method comprising:
providing a deposition apparatus that includes a platinum source and a nickel source, wherein the platinum source is separate from the nickel source;
positioning a semiconductor substrate having a semiconductor surface in the deposition apparatus;
forming a metal alloy on the semiconductor surface, wherein forming the metal alloy comprises a deposition stage in which the platinum source deposits platinum to the semiconductor surface at an initial rate at an initial period that is greater than a final rate at a final period of the deposition stage, and the nickel source deposits nickel to the semiconductor surface; and
annealing the metal alloy to react the nickel source and the platinum source with the semiconductor substrate to provide a nickel platinum semiconductor alloy.

2. The method of claim 1, wherein the metal alloy further comprises a remainder of incidental impurities.

3. The method of claim 1, wherein the initial rate of platinum deposited at the initial period comprises greater than 10% of the deposited metal alloy during the initial time period and the nickel deposited during the initial time period comprises less than 90% of the deposited metal alloy, wherein the initial time period is less than 1.0 second.

4. The method of claim 1, wherein the deposition stage includes the initial time period, an intermediate time period, and the final time period, wherein during the initial time period platinum is deposited by the platinum source and no nickel is deposited, wherein during the intermediate time period platinum is deposited by the platinum source and nickel is deposited by the nickel source, and during the final time period nickel is deposited by the nickel source and no platinum is deposited.

5. The method of claim 4, wherein during the intermediate time period platinum and nickel are codeposited, in which the platinum content in the metal alloy deposited during the intermediate time period is graded in a decreasing amount in a direction away from the semiconductor surface and the nickel content is graded in an increasing amount in the direction away from the semiconductor surface.

6. The method of claim 1, wherein the nickel source deposits nickel to the semiconductor surface at a constant rate.

7. The method of claim 1, wherein the deposition stage is 5.0 seconds long or less.

8. The method of claim 1, wherein the deposition apparatus is a sputtering apparatus comprising two targets, wherein the first target provides the platinum source and the second target provides the nickel source.

9. The method of claim 1, wherein the first target that provides the platinum source is solid elemental platinum and the second target that provides the nickel source is solid elemental nickel.

10. The method of claim 1, wherein the semiconductor surface comprises a Si-containing material or Ge containing material.

11. The method of claim 10, wherein the Si-containing material comprises monocrystalline silicon, polycrystalline silicon, silicon germanium, single crystal silicon germanium, polycrystalline silicon germanium, or silicon doped with carbon.

12. The method of claim 11, wherein the Si-containing material further comprises n-type or p-type dopants.

13. The method of claim 11, wherein annealing is provided by thermal anneal, rapid thermal anneal, laser anneal or combinations thereof.

14. The method of claim 11, wherein the annealing is at a temperature ranging from about 250° C. to about 600° C.

15. A method of forming a contact to a semiconductor device, the method comprising:
- providing a semiconductor device having a gate region present overlying a channel portion of a substrate, wherein source and drain regions are present on opposing ends of the channel portion;
- positioning the semiconductor device in a deposition apparatus that includes a platinum source and a nickel source, wherein the platinum source is separate from the nickel source;
- forming a metal alloy on an upper surface of the source and drain regions of the semiconductor device, wherein forming the metal alloy comprises a deposition stage in which the platinum source deposits platinum to the semiconductor surface at an initial rate at an initial period that is greater than a final rate at a final period of the deposition stage, and the nickel source deposits nickel to the semiconductor surface; and
- annealing the metal alloy to react the nickel source and the platinum source with the semiconductor substrate to provide contacts comprised of a nickel platinum semiconductor alloy to the source and drain regions.

16. The method of claim 15, wherein the deposition apparatus is a sputtering apparatus comprising two targets, wherein the first target provides the platinum source and the second target provides the nickel source.

17. The method of claim 15, wherein an edge of the source and region regions does not extend beyond the edge of the gate region.

18. The method of claim 15, wherein an edge of the source and drain regions is aligned to the edge of the gate region.

* * * * *